United States Patent
Ko

(10) Patent No.: US 6,177,892 B1
(45) Date of Patent: *Jan. 23, 2001

(54) EFM/DVD DEMODULATOR

(75) Inventor: Eric Ko, San Ramon, CA (US)

(73) Assignee: Oak Technology, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/224,452

(22) Filed: Dec. 31, 1998

(51) Int. Cl.[7] .................................................. H03M 7/00
(52) U.S. Cl. ............................................................. 341/106
(58) Field of Search ............................................. 341/106

(56) References Cited

U.S. PATENT DOCUMENTS

| | | | |
|---|---|---|---|
| 4,583,074 | * 4/1986 | Okamoto et al. | 341/106 |
| 4,701,744 | * 10/1987 | DeVilbiss | 341/106 |
| 5,528,628 | 6/1996 | Park et al. | 375/240 |
| 5,638,063 | 6/1997 | Ino | 341/50 |
| 5,651,087 | 7/1997 | Nagano et al. | 386/51 |
| 5,808,989 | 9/1998 | Ueki et al. | 369/48 |
| 5,828,638 | 10/1998 | Inagawa et al. | 369/54 |
| 5,835,464 | 11/1998 | Inagawa et al. | 369/50 |

OTHER PUBLICATIONS

Article entitled "Storage by Hashing, The Key Is the Address", *The Turning Omnibus*, pp. 264–270.

* cited by examiner

Primary Examiner—Trong Phan
(74) Attorney, Agent, or Firm—Townsend and Townsend and Crew LLP

(57) ABSTRACT

A technique to demodulate digital data streamed from a recording medium by periodically hashing m-bits of data to create an index to a look up table and a code word identifier. The look up table includes the modulation pattern, which has a plurality of m-bit data entries, mapped into a plurality of n-bit data clusters, with each of the plurality of data clusters including a sub-portion of one of the plurality of m-bit data entries and a cluster identifier, with each of the plurality of data clusters differing from the remaining data clusters, with n being less than mn. The index and code word identifier is determined from a sub-portion of the m-bits of data, which are then both compared with a sub-group of the plurality of data clusters. Upon finding a match between one of the data clusters of the subgroup and both the index and the code word identifier, a signal is generated.

24 Claims, 3 Drawing Sheets

EFM/DVD DEMODULATOR

CROSS-REFERENCES TO RELATED APPLICATIONS

The present application incorporates by reference for all purposes the disclosure of U.S. patent application Ser. No. 09/224,138 (Attorney Docket No. 18078-002000) entitled "INTEGRATED DVD/CD CONTROLLER" which is being filed concurrently with the present application.

BACKGROUND OF THE INVENTION

The present invention relates to code demodulation suited for use with digitally recorded information, such as, audio information or video information.

The transition of audio and video storage from the analog domain to the digital domain has revolutionized techniques for distributing audio and video information to consumers commonly referred to throughout as information. For example, digital optical storage media such as CDs and DVDs are quickly becoming the media of choice for distribution of high quality audio and video information. The rising popularity of optical storage media, such as CDs and DVDs, has given rise to an expanding market for playback systems which are capable of reproducing data read from optical storage discs.

Data is stored on the optical discs in the form of microscopic pits, and the discs are stamped in a molding machine from molten polycarbonate, then coated with a reflective layer. As the disc spins, the pits pass under a laser beam and are detected as reflected light having varying intensity, with the intensity changing at a rate in excess of 300,00 times per second. In response to detection of the reflected light, a stream of bits, i.e. ones, "1s", and zeroes, "0s", are created, defining a digital signal. A substantial portion of the information contained in the digital signal concerns modulation.

Modulation is achieved by arranging the pits, spatially, on the disc in predetermined patterns and sequences. Examples of modulation techniques include the 8 to 10 code modulation adopted in digital audiotape recorders (DAT), the EFM (18 to 14 Modulation) adopted in compact disc (CD) players and the Miller 2 (Miller squared) modulation adopted in magnetic disc devices.

Another sub-portion of the information contained in the digital signal corresponds to correction of errors that occur, for example, from disc imperfections, dust, scratches and the like. The remaining data corresponds to the audio or video information.

An additional problem that may arise when reading information from the disc is the presence of a DC component. The DC component may cause catastrophic failures in the ability to process information in the digital signal by creating variations of reference levels during binarization of the same or fluctuations in each type of error signal such as tracking error signals. Modulation techniques have been employed which suppress control of DC components.

The 8 to 16 modulation technique has become widely used for modulating information on DVD systems, such as DVD-ROM. This modulation technique results in information being stored on an optical disk employing unique sixteen bit m-bit code words to represent eight bit data symbols. These codes words have been carefully chosen to minimize the DC component and incorporate sync and merge characteristics to guarantee at least two, and at most ten, zeroes, "0s", between each group of ones, "1s".

The 8 to 16 modulation technique replaces each eight bit data symbol, referred to herein as a byte, with a sixteen bit code word selected from a set of tables (or a four-state machine), creating a physical recording sector that is split down the middle, with 1-byte sync codes inserted in front of each half-row. Each recording section on the disc has 4836 bytes, with approximately 550 unique code words out of 65536 possible combinations being selected to modulate the 8 bit data symbols. The bytes are written-out row by row to the disc as channel data using NRZI format (nonreturn to zero, inverted), where each transition from pit to land represents a one, "1", and the lack of a transition represents zeroes, "0s".

Demodulation of the information on the disc is achieved by mapping the sixteen bit code words back to the corresponding bytes, i.e., eight bit data symbols. This is achieved by comparing the sixteen bit code words, read from the disc, with code words in a look up table, LUT. Upon finding a comparison, the eight bit data symbol corresponding to the LUT code word is identified, thereby demodulating the sixteen bit code word. However, the look up table includes 550 sixteen bit code words, requiring a great amount of computational power to compare the sixteen bit code word streamed from the disc to find the corresponding code word in the look up table (LUT).

What is needed, therefore, is a computationally efficient demodulation technique.

SUMMARY OF THE INVENTION

Provided is a method and a computer program product to demodulate digital data streamed from a recording medium by substantially decreasing the processing required to compare the digital data to a demodulation pattern. This is achieved by periodically hashing a predetermined number of bits, defining a code word, to create an index to a look up table and a code word identifier. The demodulation pattern includes the data symbols of a modulation pattern mapped to a plurality of n-bit data clusters, with each of the plurality of data clusters having an address defined by a sub-portion of one of the plurality of m-bit data entries and a cluster identifier. Each address of the plurality of data clusters differs from the address associated with the remaining data clusters. The method includes receiving an m-bit code word, determining, from a sub-portion of the bits of the code word, an index to the plurality of look up sub-tables and a code word identifier; comparing the index and the code word identifier with a sub-group of the plurality of data clusters; and generating a signal upon finding a match between one of the data clusters of the subgroup and both the index and the code word. Specifically, the hashing occurs during the determining step and consists of segmenting the m-bit code word into four bit nibbles, each of which includes a preset value, with the determining step including a step of mapping the preset value associated with any one of the four nibbles to a lower value, while preserving the relative weight of the four nibbles. Thereafter, the four nibbles are multiplied by a scalar producing a plurality of results. These results are summed, defining a summed value, and the summed value is divided by the number of data clusters in one of the plurality of look up sub-tables, producing a remainder and a quotient. The remainder defines the index, and the quotient identifies the code word identifier.

DESCRIPTION OF THE SPECIFIC EMBODIMENTS

Figure 1:
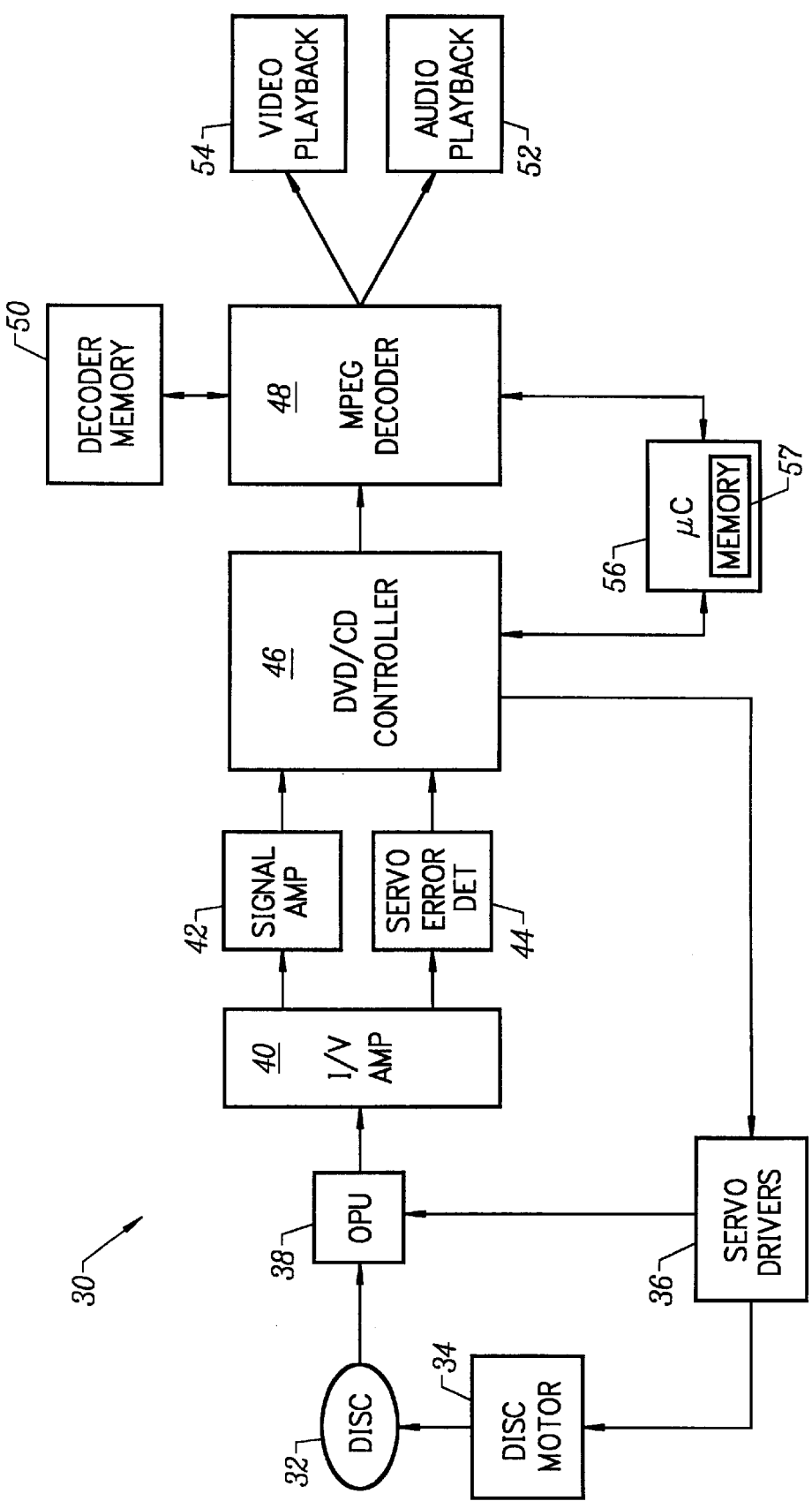
FIG. 1 is a block diagram showing a system on which to playback digital data in accordance with the present invention.

Referring to FIG. 1, a playback system 30 includes several controllers and subsystems which enable the playback of digital data stored on a disc 32. The digital data may include audio and video information, and the disc 32 may include compact discs (CDs) and digital video or versatile discs (DVDs). The controllers and subsystems, of system 30, include a disc motor 34, a servo driver 36, an optical pickup subsystem 38, a current-to-voltage amplifier 40, a signal amplifier 42, a servo error detector 44, an integrated DVD/CD controller 46 according to an aspect of the present invention, an MPEG decoder 48 coupled to a memory 50 optionally coupled to audio playback 52 and video playback 54 subsystems. Optionally, a micro-controller 56 may be in data communication with both the MPEG decoder 48 and the DVD/CD controller 46.

The disc motor 34 typically includes a spindle motor which rotates the disc. One or more of the servo drivers 36 are coupled to disc motor 34 to regulate the of rotation of the disc 32. As the disc 32 rotates, optical pickup subsystem 38 senses data stored on the disc 32. As is known in the art, data is generally stored on optical discs in the form of microscopic pits arranged in concentric circles. For example, in DVDs, the pits are typically arranged on one or more layers at two different distances from the surface of the disc. DVDs are also capable of storing data on both sides of the disc. In CDs, the pits are typically recorded at three different levels from the surface of the disc. Optical pickup subsystem 38 sense the data from CDs and DVDs by impinging radiation, such as light, onto the disc 32 surface and detecting light reflected therefrom. To that end, the optical pickup subsystem 38 may contain one or more semiconductor lasers, light detectors, and associated electronic circuitry that is mounted to sense data over the entire surface of the disc 32. Although any type of optical pickup subsystem 38 may be employed, it is preferred that the optical pickup subsystem is capable of sensing data from both DVDs and CDs.

A signal is generated from the data sensed by the optical pickup subsystem 38. The signal is typically an analog signal that is transmitted to the current-to-voltage (I/V) amplifier 40. The I/V amplifier 40 augments the current and voltage characteristics of the analog signal which is then transmitted to both the signal amplifier 42 and the servo error detector 44. The signal amplifier 42, among other things, equalizes the analog signal before being transmitted to the DVD/CD controller 46 for further processing. The servo error detector 44 recognizes errors in the data sensed the optical pickup subsystem 38 and generates error signals corresponding to these recognized errors. The error signals are transmitted to the DVD/CD controller 46 for further processing. Examples of error signals include focus error signal and tracking error signal.

The DVD/CD controller 46 is an integrated controller providing capabilities for processing the data sensed by the optical pickup subsystem 38 in different formats. The DVD/CD controller 46 provides front-end read channel functionality, CD digital signal processing functionality, DVD digital signal processing functionality, and optionally servo and disc motor control functionality. The DVD/CD controller 46 also supports a memory subsystem and associated controller for providing memory resources for the signal processing functions performed by controller 46. Functions performed by DVD/CD controller 46 include analog-to-digital conversion of the input analog signal, extraction of data and clock information from the analog signal, signal demodulation, error detection and correction, and providing an interface to MPEG decoder 48. In a specific embodiment, demodulation functions performed by DVD/CD controller 46 include Eight-to-Fourteen (EFM) demodulation, typically used for data read from a CD, EFMPlus (EFM+) demodulation, typically used for data read from a DVD, and subcode demodulation, discussed more fully below.

The interface between the DVD/CD controller 46 and the MPEG decoder 48 is typically a parallel interface. In a specific embodiment, an eight bit parallel interface is provided. The output data stream from the DVD/CD controller 46 to the MPEG decoder 48 may be compact disc digital audio (CD-DA) data as defined by the Red Book standard, compact disc read-only memory (CD-ROM) data as defined by the Yellow Book standard, or an MPEG program stream. In a specific embodiment, the DVD/CD controller 46 handles 2X DVD bit stream, including support of special effects, and up to a 16X CD bit stream.

The MPEG decoder 48 decodes, or reconstitutes, the data stream received from the DVD/CD controller 46, converting it into audio data, video data, or both, for output to audio and video playback subsystems 52 and 54, respectively. The MPEG decoder 48 is typically a MPEG-II decoder which receives a MPEG-II data stream from the DVD/CD controller 46 and converts it into studio quality audio and video outputs. MPEG decoder 48 extracts timing information from the MPEG data stream, and de-multiplexes the compressed MPEG data stream into decompressed audio and video data streams. The MPEG decoder 48 generally includes a MPEG audio decoder, which decompresses and decodes the compressed MPEG audio stream to produce a decompressed audio data stream, and a MPEG video decoder which decompresses and decodes the compressed MPEG video data stream to produce a decompressed video data stream. The decompressed audio and video streams may then be forwarded to audio and video output subsystems 52 and 54 for playback. The timing information extracted by the MPEG decoder 48 is used to synchronize the audio and video outputs. The decoder memory 50 may optionally be coupled to the MPEG decoder 48 to provide memory resources for the decoding process.

The microcontroller 56 is employed to regulate the operations of the playback system 30. To that end, the microcontroller 56 may be programmed to translate user inputs into commands for the DVD/CD controller 46 or the MPEG decoder 48. The microcontroller 56 may also be employed to monitor the data flow in the DVD/CD controller 46 and the MPEG decoder 48. In a specific embodiment, the microcontroller 56 is coupled to the DVD/CD controller 46 using an eight bit data bus.

Figure 2:
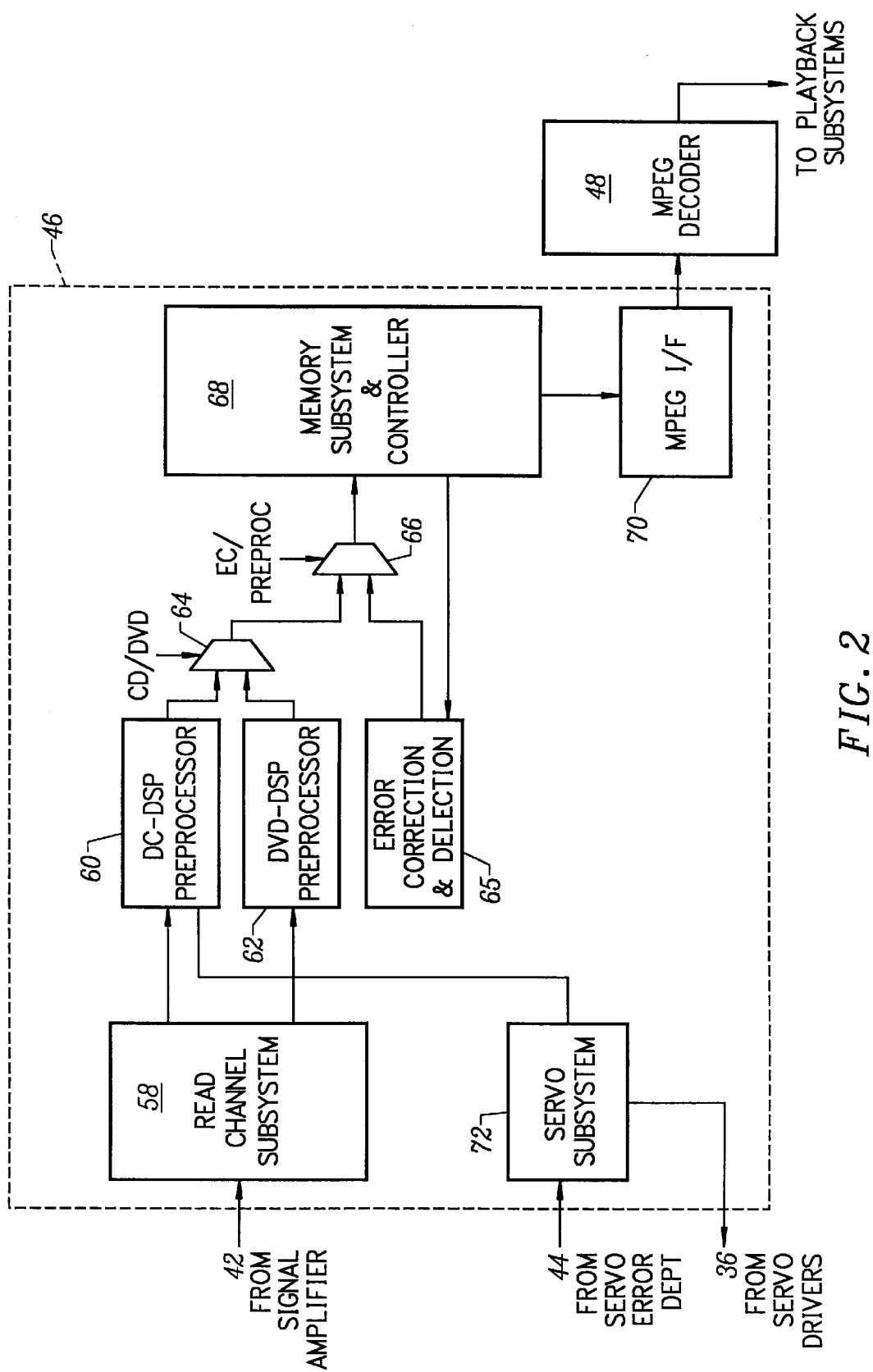
FIG. 2 is a detailed block diagram of the controller shown above in FIG. 1.

Referring to FIG. 2, the DVD/CD controller 46 includes a read channel subsystem 58 connected to a CD digital signal preprocessor (CD-DSP) 60, and a DVD digital signal preprocessor (DVD-DSP) 62. An error correction and detection (EC&D) subsystem 65 is connected to the DVD digital signal preprocessor (DVD-DSP) 62. A multiplexer 66 is connected to receive signals from CD-DSP preprocessor 60, the DVD-DSP preprocessor 62 and the error correction and detection (EC&D) subsystem 65. A multiplexer 68 is connected to receive inputs from the EC&D subsystem 65 and the multiplexer 66. A memory subsystem and controller 68 is connected to both an MPEG interface subsystem 70 and the EC&D subsystem 65. The interface subsystem 70 is connected to the MPEG decoder 48.

Referring to both FIGS. 1 and 2, a servo subsystem 72 receives servo error control signals generated by servo error detector 44 as input. As previously described, these signals typically include a focus error signal, a tracking error signal, and a track-crossing pulse. The servo subsystem 72 generally is composed of four closed-loop servos, including a disc motor servo, a sled servo, a focus servo, and a tracking servo. The servo subsystem 72 also receives sync pattern information from the CD-DSP preprocessor 60 and the DVD-DSP preprocessor 62. Based on the input servo error control signals and sync pattern information, the servo subsystem 72 outputs control voltages to the servo drivers 36, to correct the rotation speed, to move the sled which houses the OPU 38 to the right track, to move up or down the optical pickup to a proper distance from the disc, or to correct the off-track error.

The read channel subsystem 58 received the equalized signal from the signal amplifier 42 as input. The read channel subsystem 58 converts the input analog signal to a digital signal using baseline tracking techniques. The read channel subsystem 58 also extracts bit rate and data rate information from the input signal. The read channel subsystem 58 then determines the mode of operation of the playback system 30. If the playback system 30 is operating in CD mode, then the digital signal is forwarded to the CD-DSP preprocessor 60. If the playback system 30 is operating in DVD mode, then the digital signal is forwarded to the DVD-DSP preprocessor 62 for further processing.

The CD-DSP preprocessor 60 performs sync detection and demodulation functions on the input CD information signal as defined by the Red Book standard. The Typically, EFM demodulation is performed on CD information. The DVD-DSP preprocessor 62 performs sync detection and demodulation functions on the input DVD information signal as defined by standards published by the DVD consortium. Typically, EFMPlus demodulation is performed on DVD information. The sync information detected by preprocessors 60 and 62 is forwarded to the servo subsystem 72.

Depending on the mode of operation of playback system 60, CD or DVD, multiplexer 64 selects either the output from CD-DSP preprocessor 60 or DVD-DSP preprocessor 62 to be written to the memory subsystem 68 via the multiplexer 66. The multiplexer determines whether to write information from the preprocessors 60 and 62 or from the EC&D subsystem 65 to memory 68.

The EC&D subsystem 65 is responsible for performing error detection and correction for both CD and DVD information. The EC&D 65 reads CD or DVD information written to the memory 68 by the CD-DSP preprocessor 60 or the DVD-DSP preprocessor 62. The EC&D 65 then performs error detection and correction as defined by the Red Book standard for CD information and by standards published by the DVD consortium for DVD information. In one embodiment, Reed-Solomon error correction codes are used for error correction purposes. After performing error detection and correction, the corrected information is written back to the memory subsystem 68. The memory subsystem 68 provides memory resources for internal operations of DVD/CD controller 62. Unlike conventional playback systems which include redundant memory resources, the memory subsystem 62 provides a common memory resource for processing performed by the CD-DSP preprocessor 60, the DVD-DSP preprocessor 62 and the EC&D subsystem 65. By allowing sharing of memory resources between preprocessors 60 and 62, and the EC&D 65, the DVD/CD controller 46 reduces the number of memory chips required for audio and video processing, thus reducing the amount of playback system real estate occupied by various subsystems. A controller is typically associated with the memory subsystem 68 to facilitate address generation, resolve memory timing, and arbitrate the memory resources. The corrected information written by the EC&D 65 is forwarded to the MPEG interface (MPEG I/F) 70 for further processing.

The MPEG interface 70 provides an interface for transferring processed information from the DVD/CD controller 46 to the MPEG decoder 48. Thus, unlike conventional playback systems which require an ATAPI interface and a host CPU for transferring information to the MPEG decoder, a dedicated MPEG interface 70 is implemented which allows information to be directly transferred to MPEG decoder 48.

The DVD/CD controller 46 performs 16 to 8 demodulation of the DVD data. This is achieved by periodically hashing a predetermined number of bits streamed from the disc 32. Specifically, the DVD-DSP preprocessor 62 arranges the information collected read from the disc 32 into groups of m-bits, defining a code word. Although the code word may include any quantity of bits, it is preferred that each code word includes sixteen bits of data, a sub-portion thereof corresponding to a data symbol. After receiving and arranging the sixteen bit code word, an index and code word identifier is associated therewith. The index and code word identifier are calculated from a sub-portion of the bits thereof by identifying four multiple-bit nibbles, each of which includes a preset value. Typically, the four nibbles are of equal length, four bits, which define the preset value. The four nibbles consist of the first, second, third and fourth nibbles, from least significant to most significant bits, respectively. That is, the first nibble includes the four least significant bits of the sixteen bits that comprise the code word. The second nibble includes the penultimate four least significant bits; the fourth nibble includes the four most significant bits; and the third nibble includes the four bits having significance between those bits associated with the fourth and second nibbles.

Analyzing the first nibble, the code word is associated with one or more of four states. A first nibble with the value of either "1", "2", or "9" is associated with state one. A first nibble with a value of either "4", or "8" is associated with either state two and state three. Were the first nibble to have a value of "0", then the second nibble is analyzed to determine whether the two least significant bits in that nibble have a zero value. If so, the code word is associated with state four. Otherwise, the nibble is associated with state 2 and 3.

After associating the code word with the proper state, the four nibbles thereof are multiplied by a scalar producing a plurality of results as follows:

$$r_1 = n_1 \times A^3 \qquad (1)$$

$$r_2 = n_4 \times A^2 \qquad (2)$$

$$r_3 = n_3 \times A \qquad (3)$$

where $n_1$, $n_3$ and $n_4$ are the preset values of the first, third and fourth nibbles, respectively. Results $r_1$, $r_2$ and $r_3$ are then summed, along with $n_2$, to obtain a summed values, $r_s$ follows:

$$r_s = r_1 + r_2 + r_3 + n_2 \qquad (4)$$

The summed value $r_s$ is divided by a preset value DC, producing a remainder and a quotient as follows:

$$r_s/DC = \text{quotient} + \text{remainder} \quad (5)$$

where DC represents the number of entries in a look up table. The remainder defines the index of a look up table and the quotient defines the code word identifier. The combination of the index and the code word identifier define a unique address in a look up table containing the data symbol corresponding to the code word. After obtaining the index and the code word identifier, these quantities are compared with a demodulation pattern consisting of the data symbol, of the pattern employed to modulate the data onto the disc 32, that are mapped to the various addresses of a look up table. The addresses of the look up table are a function of the information contained in the sixteen bit code word. Specifically, each address of a subgroup of the addresses of the look up table is a function of the information contained in the sixteen bit code word that corresponds to the data symbol contained therein. Upon finding a match between an address in the look up table and both the index and code word identifier, a signal is generated which contains information associated with the data symbol contained at the address.

The advantage with the aforementioned hashing is that it facilitates associating virtually all of the data symbols with a unique twelve bit code while substantially reducing the number of data symbols having a common twelve bit code, i.e., redundancy. In this manner, the computational efficiency of demodulating sixteen bit code words is achieved by requiring only a comparison of twelve bits of data to obtain a data symbol corresponding to the sixteen bit code word. A further increase in computational efficiency may be obtained by mapping the values of the four nibbles $n_1$, $n_2$, $n_3$ and $n_4$ to values of a reduced magnitude, while maintaining the same relative weight among the nibbles $n_1$, $n_2$, $n_3$ and $n_4$. For example, it is preferred to map the nibbles $n_2$, $n_3$ and $n_4$ from the set of values $\{0,1,2,4,8,9\}$ to the set of values $\{0,1,2,3,4,5\}$. The nibble $n_1$ may be mapped from either set of values $\{1,2,9\}$ or $\{0,4,8\}$ to the set of values $\{0,1,2\}$. In this manner, nibble values $n_1$, $n_2$, $n_3$ and $n_4$ are mapped to nibble values $N_1$, $N_2$, $N_3$ and $N_4$.

The hashing function is then applied to the nibbles as follows:

$$\text{Look up table address} = N_1 \times A^3 + N_4 \times A^2 + N_3 \times A + N_2 \quad (6)$$

Where A=six. The index and the remainder are quotient are calculated as discussed above and shown as follows:

$$\text{look up table address}/D_C = \text{quotient} + \text{remainder} \quad (7)$$

where $D_C$ equals 64.

Figure 3:
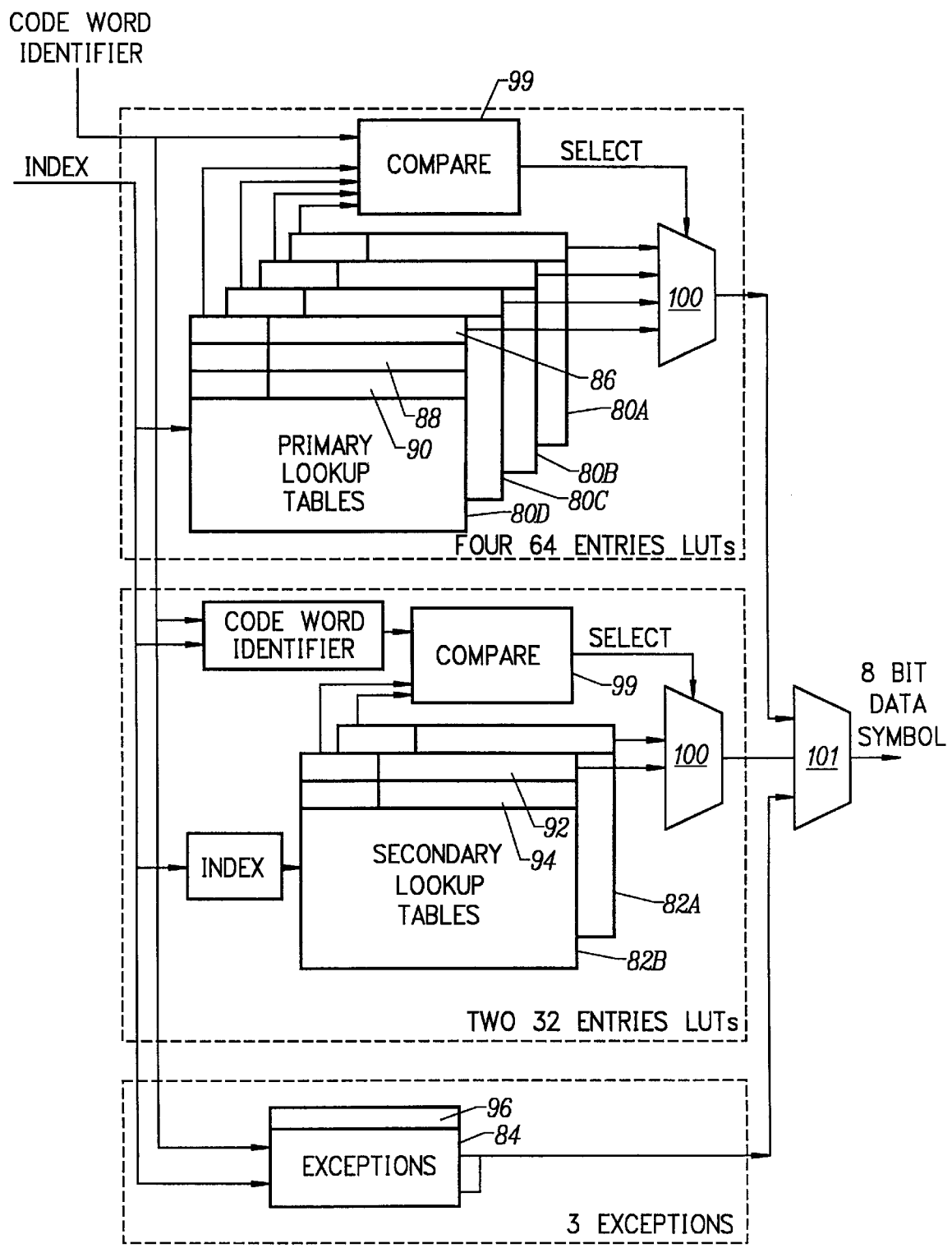
FIG. 3 is a block diagram showing the mapping of a demodulation pattern into a memory of the controller shown above in FIG. 2.

Referring to both FIGS. 2 and 3, the demodulation pattern, is formed by mapping the modulation pattern into the memory subsystem 68 as a look up table that consists of a plurality of sub-tables, each of which has a plurality of n-bit data clusters, with n being less than m. Each of the data clusters have a unique address that is defined by a sub-portion of one of the m-bit code word. Although any modulation pattern may be employed, it is preferred to derive the demodulation pattern from the modulation pattern associated with the modulation technique employed for DVD Specification for Read-Only Disc/Part One Physical Specification Version 1.0, published in August 1996 and may be obtained by contacting by Toshiba Corporation 1-1, Shibaura 1-Chome, Minato-ku, Tokyo 105-01, Japan. Specifically, entries of the aforementioned modulation pattern associated with state one consist of 296 sixteen bit code words, each of which has a data symbol associated therewith. These data symbols, are defined by a sub-portion of the information contained in the sixteen bits of information of each code word. The data symbols are mapped among a plurality of addresses in the memory subsystem 68 of the DVD/CD controller 46, as four primary tables 80A, 80B, 80C and 80D, two secondary tables 82A and 82B, and exceptions table 84.

The addresses chosen for each of the data symbols are derived from applying equations 1–5, above, to each of the sixteen bit code words of the modulation pattern. To that end, each of the primary tables 80A, 80B, 80C and 80D have sixty-four data clusters, shown as 86, 88 and 90. Out of the 256 data clusters in the primary look up tables, 80A, 80B, 80C and 80D, 246 contain data symbols corresponding to the data symbols of the modulation pattern. Each of the secondary tables 82A and 82B have thirty-two data clusters, shown as 92 and 94 in secondary look up table 82. Forty-seven of the sixty-four data clusters contain information corresponding to the data symbols of the modulation pattern. However, given that the data symbols are stored in memory as eight bits, redundancy occurs in that two different data symbols may be associated with the same address, defined herein as collision. To resolve that aforementioned collision, a cluster identifier is calculated for each data symbol, which is four bits in length, so that a unique address may correspond to each data symbol. To that end, each of the data clusters in the primary and secondary tables are twelve bits in length. In this fashion, the data symbols may be uniquely associated with twelve bits of information, instead of sixteen bits.

However, this results in three pairs of data symbols being mapped so that any two data symbols in a given pair have identical addresses, referred to herein as collision. To avoid the collision among any given pair, three of the sixteen bit code words corresponding to these data symbols are mapped in the three sixteen bit data clusters, shown as 96, in the exceptions table 84.

In operation, upon determining the index and code word identifier for the sixteen bit word stream from the disc 32, this information is used to search for the corresponding data symbol and cluster identifier in parallel at the primary look up tables 80A, 80B, 80C and 80D, the secondary look up tables 82A and 82B and the exceptions table 84. The cluster identifier located at the address in the look up table corresponding to the code word identifier is read from the memory into a comparator circuit 99, and the data symbol corresponding thereto is read into a latch 100. If the code word identifier matches the cluster identifier, a signal is generated by the comparator circuit 99 allowing the data symbol to be transmitted from the latch 100 to the output buffer 101, thereby generating a signal containing information corresponding to a data symbol. This is achieved by the following subroutine (written in "C" programming language):

```
If (index <31) {
    code word identifier = map({5, 6, 7, 8, 9} → {0, 1, 2, 3, 4});
} else {
    code word identifier = {5, 6, 7, 8, 9};
}
index' = index % 32;
```

The valid code word identifiers for the secondary look up tables are 5, 6, 7, 8 and 9.

The look up tables for states two and three are similar, because each state has 206 data symbols associated with a code word. The data symbols are mapped so as to be contained in data clusters among four primary look up tables (not shown), each of which has sixty-four data clusters. In this fashion, 195 data symbols are mapped to correspond to 195 data clusters. The eleven remaining data symbols are mapped to an exceptions table (not shown) to correspond to the remaining eleven code words that correspond thereto.

The look up tables for state four include two thirty-two data cluster primary tables (not shown) that are similar to the secondary tables 82a and 82b of state 1. In this manner, the data symbols associated with state four code words are mapped to correspond to one of sixty-four data clusters arranged in two thirty-two data cluster primary tables (not shown). This is achieved by the following subroutine:

```
If (index >31) {
  code word identifier = map({0, 1, 2, 3, 4} → {5, 6, 7, 8, 9});
} else {
  code word identifier = {0, 1, 2, 3, 4};
}
index' = index % 32;
```

The valid code word identifier for state four are 0, 1, 2, 3 and 4.

Error detection and correction is then performed by the DVD-DSP preprocessor 62 data demodulation has been performed. The resultant data stream is then read into the memory subsystem and controller 68. The contents of the memory subsystem and controller 68 may then be read by EC&D subsystem 65 to detect and correct errors in the data read from a DVD. Standard DVD error detection and correction techniques, as defined by the DVD consortium and CD Red Book specifications, are used for error correction. DVD error correction techniques include Reed Solomon (RS) 208, 192 (outer product code) and 182, 172 (inner product code) techniques.

As would be understood by those have ordinary skill in the art, the foregoing operation may be carried out using hardware, e.g., combinational logic; software or a combination of both. Any such software, i.e., program code, used would be stored in a computer-readable medium; for example, a conventional memory 57 (e.g., ROM or RAM) disposed in microcontroller 56. More generally, such computer-readable media includes any article of manufacture that can be read by a computer or a carrier wave signal carrying information that can be read by a computer. For example, the program code may be disposed in semiconductor memory, e.g., RAM, ROM and the like; optical media, e.g., CD-ROM, DVD and the like, as well as magnetic media, e.g., floppy disk, magnetic tape and the like; or carrier wave signal received through a network. Therefore, the specification and drawings are not an exhaustive disclosure of the invention, but merely are illustrative and the scope of the invention should be interpreted in view of the pending claims including the fall scope of equivalents of them.

What is claimed is:

1. A computer program product to demodulate digital data using a computer having a modulation pattern stored as a plurality m-bit data entries in a plurality of look-up tables, each of which includes said look-up tables having a plurality of n-bit data clusters, with each of said plurality of data clusters including a sub-portion of one of said plurality of data entries and a cluster identifier so that each of said plurality of data clusters differs from the remaining data clusters, with n being less that m said computer program product, comprising:

a computer readable medium having program code to demodulate said digital data and including:

first computer-readable code to receive an m-bit code word;

second computer-readable code to determine, from a sub-portion of the bits of said m-bit code word, an index to said plurality of look up tables and a code word identifier;

third computer-readable code to compare said index and said code word identifier with a sub-group of said plurality of data clusters; and fourth computer-readable code to generate a signal upon finding a match between one of said data clusters of said subgroup and both said index and said code word.

2. The computer program product as recited in claim 1 wherein said m-bit code word includes first, second, third and fourth nibbles each of which includes a predetermined amount of data bits from least significant to most significant bits, respectively, with said second computer-readable code to determine said index and said code word identifier further including fifth computer-readable code to multiply said first, third and fourth nibbles by a scalar producing a plurality of results, summing said results, defining a summed value.

3. The computer program product as recited in claim 2 further including sixth computer-readable code to divide said summed value by a number of data clusters in one of said plurality of look up tables, producing a remainder and a quotient, with said index being defined by said remainder and said m-bit code word identifier being defined by said quotient.

4. The computer program product as recited in claim 3 wherein said plurality of look up tables include four primary tables, two secondary tables and one exception table.

5. The computer product as recited in claim 1 wherein said plurality of look up tables include four primary tables each of which has 64 data clusters and an exception table having eleven data clusters.

6. The computer product as recited in claim 1 wherein said plurality of look up tables include two primary tables, each of which has 2 data clusters.

7. The computer program product as recited in claim 4 wherein said first nibble is multiplied by 216, said fourth nibble is multiplied by 36 and said third nibble is multiplied by 6 with said one of said plurality of look up tables having 64 data clusters.

8. The computer program product as recited in claim 7 wherein said primary tables each has 64 data clusters, said secondary tables each have 32 data clusters, and said exception table has 3 data clusters.

9. A method of demodulating digital data, said method comprising:

mapping a modulation pattern, having a plurality m-bit data entries, into a plurality of look-up tables, each of which includes a plurality of n-bit data clusters, with each of said plurality of data clusters including a sub-portion of one of said plurality of data entries and a cluster identifier so that each of said plurality of data clusters differs from the remaining data clusters, with n being less that m;

receiving an m-bit code word;

determining, from a sub-portion of the bits of said code word, an index to said plurality of look up tables and a code word identifier;

comparing said index and said code word identifier with a sub-group of said plurality of data clusters; and generating a signal upon finding a match between one of said data clusters of said subgroup and both said index and said code word.

10. The demodulation method as recited in claim 9 wherein said determining step includes a step of hashing said m-bit code word.

11. The demodulation method as recited in claim 9 wherein said m-bit code word includes four nibbles each of which includes a preset value, with said determining step including a step of mapping the preset value associated with any one of said four nibble to a lower value.

12. The demodulation method as recited in claim 9 wherein said m-bit code word includes four nibbles each of which includes a predetermined amount of data bits, with said determining step including a step of multiplying said four nibbles by a scalar producing a plurality of results, summing said plurality of results, defining a summed value and dividing said summed value by a number of data clusters in one of said plurality of look up tables, producing a remainder and a quotient, with said index being defined by said remainder and said m-bit code word identifier being defined by said quotient.

13. The demodulation method as recited in claim 9 wherein said plurality of look up tables include four primary tables, two secondary tables and one exception table.

14. The demodulation method as recited in claim 13 wherein said primary tables each has 64 data clusters, said secondary tables each have 32 data clusters, and said exception table has three data clusters.

15. The demodulation method as recited in claim 14 wherein said m-bit code word includes first, second, third and fourth nibbles each of which includes four bits of data from least significant to most significant bits, respectively, with said determining step including a step of multiplying said first, third and fourth nibbles by a scalar producing a plurality of results, summing said results, defining a summed value and dividing said summed value by a number of data clusters in one of said plurality of look up tables, producing a remainder and a quotient, with said index being defined by said remainder and said m-bit code word identifier being defined by said quotient.

16. The demodulation method as recited in claim 9 wherein said plurality of look up tables include four primary tables each of which has 64 data clusters and an exception table having eleven data clusters.

17. The demodulation method as recited in claim 9 wherein said plurality of look up tables include two primary tables, each of which has 32 data clusters.

18. A method of demodulating digital data, said method comprising mapping a modulation pattern, having a plurality m-bit data entries, into a plurality of look-up tables, each of which includes a plurality of n-bit data clusters, with each of said plurality of data clusters including a sub-portion of one of said plurality of data entries and a cluster identifier so that each of said plurality of data clusters differs from the remaining data clusters, with n being less that m;

receiving an m-bit code word having a four nibbles of information, each of which include a predetermined quantity of data bits;

hashing said m-bit code word by multiplying said four nibbles by a scalar to produce a plurality of results, summing said plurality of results, defining a summed value and dividing said summed value by a number of data clusters in one of said plurality of look up tables, producing a remainder and a quotient, with said remainder defining index to said plurality of look up tables and said quotient defining a code word identifier; comparing said index and said code word identifier with a sub-group of said plurality of data clusters; and generating a signal upon finding a match between one of said data clusters of said subgroup and both said index and said code word.

19. The demodulation method as recited in claim 18 wherein said four nibbles comprise of a first, a second, a third and a fourth nibble each of which includes a predetermined four data bits, from least significant to most significant bits, respectively, with said hashing step includes steps of multiplying said first nibble by 216, multiplying said fourth nibble by 36, multiplying said third nibble by 6, and multiplying said second nibble by unity.

20. The demodulation method as recited in claim 18 wherein said plurality of look up tables include four primary tables, two secondary tables and one exception table, with one of said four primary tables having 64 data clusters.

21. The demodulation method as recited in claim 20 wherein said primary tables each has 64 data clusters, said secondary tables each have 32 and said exception table has 3 data clusters.

22. The demodulation method as recited in claim 18 wherein said plurality of look up tables include four primary tables each of which has 64 data clusters and an exception table having eleven data clusters.

23. The demodulation method as recited in claim 18 wherein said plurality of look up tables include two primary tables, each of which has 32 data clusters.

24. The demodulation method as recited in claim 18 wherein said m-bit code word includes four nibbles each of which includes a preset value, with said determining step including a step of mapping the preset value associated with any one of said four nibble to a lower value.

* * * * *